US007564925B2

(12) United States Patent
Bisson et al.

(10) Patent No.: US 7,564,925 B2
(45) Date of Patent: Jul. 21, 2009

(54) ANALOG-TO-DIGITAL CONVERTER WITH A DECISION CIRCUIT AND AN OPTIMIZED DECISION THRESHOLD

(75) Inventors: Arnaud Bisson, Orsay (FR); Omar Ait Sab, Arpajon (FR)

(73) Assignee: Alcatel, Paris (FR)

( * ) Notice: Subject to any disclaimer, the term of this patent is extended or adjusted under 35 U.S.C. 154(b) by 588 days.

(21) Appl. No.: 11/313,908

(22) Filed: Dec. 22, 2005

(65) Prior Publication Data

US 2006/0140306 A1 Jun. 29, 2006

(30) Foreign Application Priority Data

Dec. 23, 2004 (FR) .................................. 04 53202

(51) Int. Cl.
*H03K 9/00* (2006.01)
*H04B 10/06* (2006.01)
(52) U.S. Cl. ...................................... 375/316; 398/210
(58) Field of Classification Search ................. 375/316, 375/317, 319, 322, 324, 325, 326, 340, 354, 375/355, 359; 398/202, 182, 208, 209, 210; 327/1, 23, 27, 100, 141, 144, 151
See application file for complete search history.

(56) References Cited

U.S. PATENT DOCUMENTS

| 6,147,486 | A  | * | 11/2000 | Koss et al. ................... 324/166 |
| 6,583,903 | B1 | * | 6/2003  | Way et al. .................... 398/152 |
| 6,877,117 | B1 | * | 4/2005  | Childers et al. ............. 714/704 |
| 7,054,402 | B2 | * | 5/2006  | Muellner ..................... 375/355 |
| 2006/0110170 | A1 | * | 5/2006 | Wang .......................... 398/208 |

FOREIGN PATENT DOCUMENTS

EP 0 531 549 A1 3/1993
WO WO 92/14322 A1 8/1992

OTHER PUBLICATIONS

Kawai et al. "Smart Optical Receiver With Automatic Decision Threshold Setting and Retiming Phase Alignment", IEEE Journal of Lightwave Technology, vol. 7, No. 11, Nov. 1989, pp. 1634-1640.*

* cited by examiner

*Primary Examiner*—Mohammad H Ghayour
*Assistant Examiner*—Vineeta S Panwalkar
(74) *Attorney, Agent, or Firm*—Sughrue Mion, PLLC

(57) ABSTRACT

The device includes a decision circuit (6a) for providing, by comparing the amplitude of a received modulated signal (Sr) to a decision threshold (Vth, Th), a binary signal (Sb) with two states respectively representing first and second binary values that respectively correspond to low and high values of the received signal. A counting module (12) activated during successive time periods calculates a differential numerical value (DN, SDN) representing the algebraic difference between the two numbers of bits of the binary signal that respectively have the second binary value and the first binary value. At the end of each time period, an adjustment module (15) increases or decreases the threshold value (Vth, Th) by an increment (Dth) according to whether the sign (SDN) of the difference is respectively positive or negative. Application in particular to systems for transmitting digital data at high bit rates over optical connections.

7 Claims, 2 Drawing Sheets

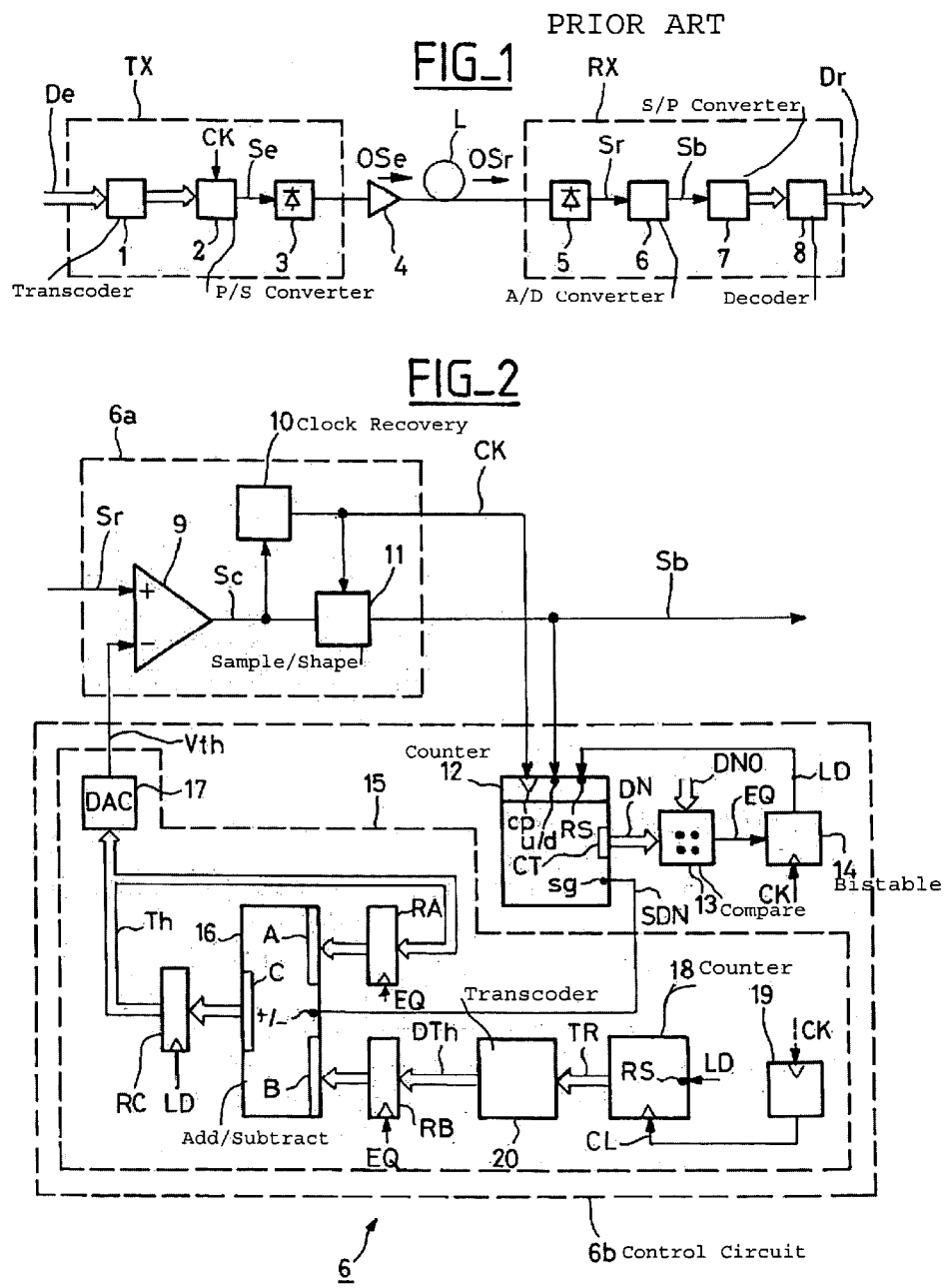

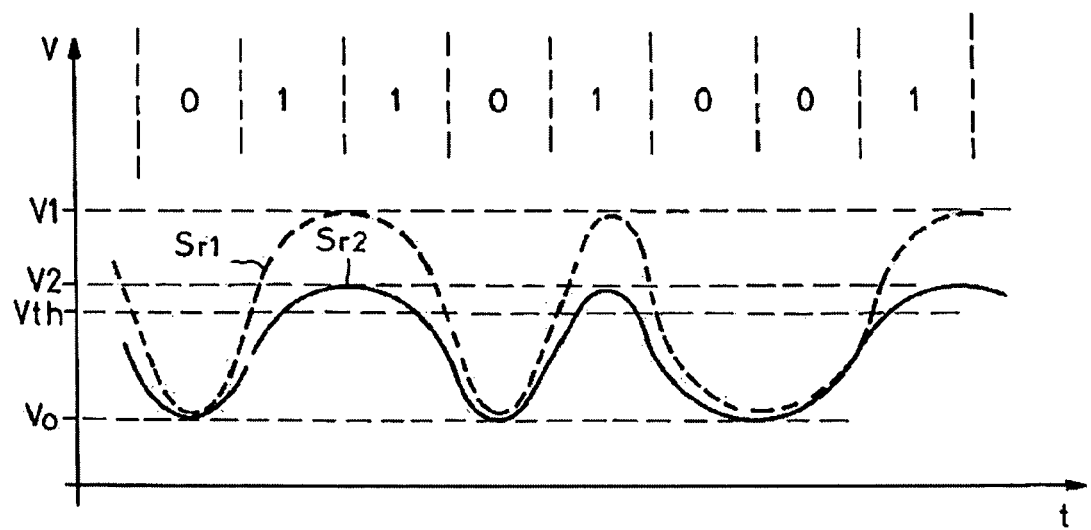
FIG_3
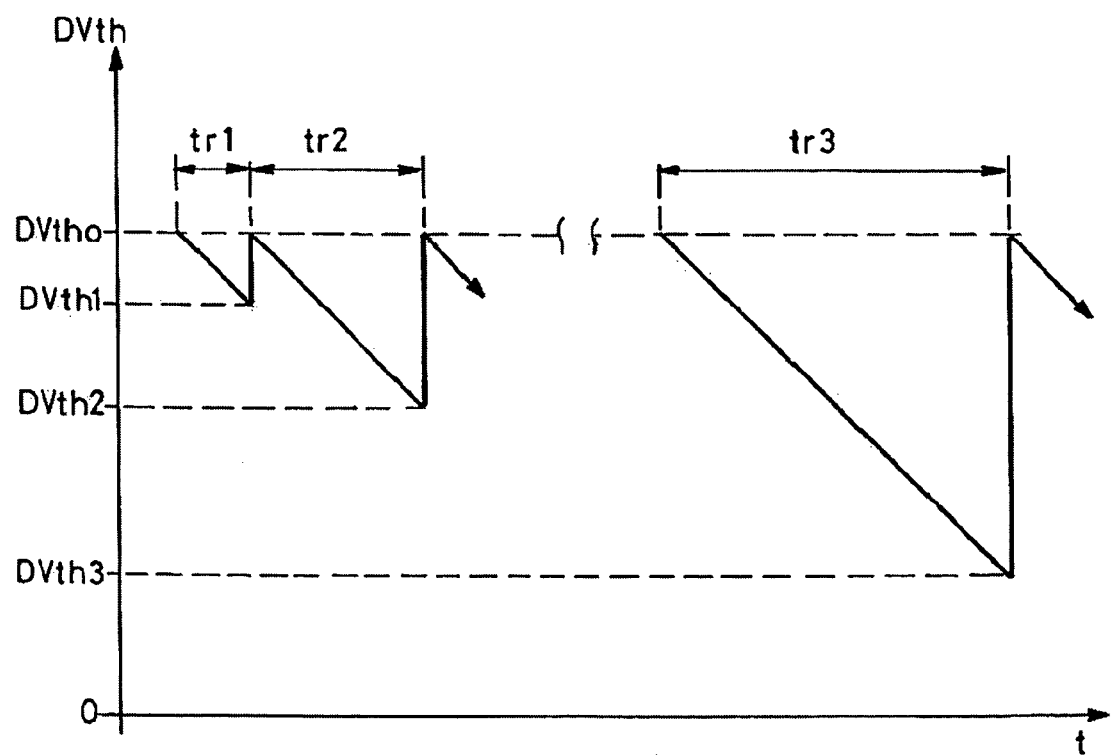
FIG_4

ANALOG-TO-DIGITAL CONVERTER WITH A DECISION CIRCUIT AND AN OPTIMIZED DECISION THRESHOLD

BACKGROUND OF THE INVENTION

The invention relates to telecommunications systems for transmitting digital data. It relates more particularly to techniques for receiving high bit rate digital signals transmitted over long-haul optical fiber connections, for example.

A transmission system typically includes one or more transmitters connected to a receiver via a connection which, in the case of an optical signal, may consist of a single fiber and/or a more complex connecting medium including optical amplifiers and switches constructed from couplers, waveguides and optical gates, for example.

FIG. 1 is a diagram of one example of a transmission system. An optical transmitter TX is coupled to one end of an optical connection L, here via an optical amplifier 4, to inject an optical signal OSe into it. The other end of the connection, coupled to an optical receiver RX, delivers to it an optical signal OSr resulting from the transmission of the send signal OSe.

Information to be transmitted is conventionally supplied to the transmitter TX by a station (not shown) and is generally in the form of digital data De organized into successive bits. The data is applied to a parallel interface of the transmitter. Starting from that interface, the transmitter includes a processing system comprising in succession a transcoder module 1, a parallel-to-serial converter 2 and an electrical-to-optical converter 3. These components code the digital data De and convert it into a serial binary signal Se in the form of a modulated electrical signal which is then converted into an optical signal OSe by modulating an optical carrier wave as a function of the electrical signal Se.

In order to use wavelength division multiplexing as well, the system is equipped with a multiplexer (not shown) between the converter 3 and the amplifier 4 for combining a plurality of signals originating from a plurality of transmitters and carried by different wavelengths. In this case, it is also necessary to provide a demultiplexer (not shown) between the receive end of the connection and each receiver.

The receiver RX includes a processing system comprising in succession an optical-to-electronic converter 5 receiving the optical signal OSr and supplying a modulated electrical signal Sr, an analog-to-digital converter 6 forming from the signal Sr a serial binary signal Sb, a serial-to-parallel converter 70, and a decoder 8 for supplying received digital data Dr corresponding to the sent digital data De.

The parallel-to-serial converter 2 of the transmitter creates a modulated electrical signal Se at the timing rate of a send clock Ck in order to write bits in successive time periods each having a duration equal to the clock period. The send clock frequency (also known as the bit frequency) determines the transmission bit rate.

The electrical signal Se is obtained by modulating the amplitude of an electrical parameter (typically the voltage) in accordance with one of the standard modulation formats, generally of the NRZ or RZ type. The signal Se therefore carries successive bits in the form of modulation between low and high amplitude levels respectively representing first and second bit values, here designated "0" and "1", respectively, in accordance with the usual convention.

Converting the signal Se into an optical signal OSe consists in modulating the carrier wave, generally modulating its amplitude, although its phase or its optical frequency, or a combination of the above physical parameters, can be modulated.

The optical-to-electronic converter 5 of the receiver RX is adapted to the type of modulation selected for sending in order to supply a modulated electrical signal Sr that reproduces the send electrical signal Se. Like the send signal Se, the receive signal Sr carries successive bits in the form of modulation between low and high amplitude levels respectively representing binary values 0and 1, according to the convention.

The device 6 for converting the received signal Sr into a digital serial signal must implement two main functions: recovering the timing of the send clock CK from the received signal Sr, and comparing the amplitude of the receive signal Sr to a decision threshold level, the result of this comparison being taken into account during sampling windows synchronized by the recovered clock timing and phase-locked to the signal. As a result of this comparison, a serial binary signal Sb, i.e. a signal modulated in time with the clock CK, is obtained that is able to assume a first or a second discrete state during each bit period, these two states (which are typically first and second fixed voltage levels) respectively representing low and high amplitude levels of the receive signal Sr, i.e. respectively representing first and second binary values 0and 1, according to the convention.

The binary signal Sb may then be processed by standard digital circuits farther downstream in the receiver using the recovered clock (in particular the serial-to-parallel converter 7 and the decoder 8).

The clock timing recovery and comparison functions are implemented by a circuit usually called the "decision circuit" in which the value assigned to a decision threshold level is a critical parameter for correct recognition of the successive binary values received after transmission. In favorable circumstances (stable and calibrated sending sources, short transmission distances, low bit rate, low optical noise, little degradation by the optical connection), this value may be fixed, and is generally made substantially equal to the mean of the low and high levels of the receive signal Sr.

On the other hand, the device 6 will have to include control means for automatically compensating the fluctuations if the low and high levels are liable to fluctuate strongly, for example according to the source that sent the signal, as a function of the path that it has taken in the network, or following variations in optical noise or distortion of the signal caused by non-linear effects.

To this end, prior to the comparison, the receive signal Sr may be processed by an amplifier associated with an automatic gain control system which adjusts the mean amplitude (or DC component) of the signal to a constant level, for example an integrator filter type analog circuit which receives the signal Sr at its input and supplies at its output a gain control signal that is applied to a variable gain amplifier.

Another solution is to use a circuit similar to the above circuit to maintain the threshold level at an optimum value allowing for the mean amplitude of the receive signal Sr.

The drawback of the above methods is that it is difficult to implement the analog circuit with sufficient adjustment accuracy. Moreover, its bandwidth and time constants must be optimized as a function of the bit rate, which does not facilitate upgrades by increasing the bit rate of an already installed system.

Another approach is to exploit the fact that digital data transmission systems often employ forward error correction (FEC) methods to calculate in real time the error rate affecting received data. Error detector and corrector codes are conventionally used for this, and the transmitter calculates redundant data as a function of the selected code and the information data De to be sent, and that redundant data is then sent with the information data. The redundant data is calculated for successive blocks of information data and then combined with them to form frames that are sent successively.

The data of each frame received by the receiver is processed by an error detection and correction module to calculate error syndromes representing the locations of any errors detected and to correct them. This module supplies other information, such as the number of errors detected, the error rate, etc. The redundant data is calculated in the transcoding module 1 shown in FIG. 1, for example. The error syndromes are processed in the decoder 8, for example.

In this context, the threshold level may be adjusted automatically by seeking an optimum value that minimizes the error rate. One embodiment uses an optimization algorithm and the parameters to be minimized are successive values of the error rate measured for the successive frames received. This method may prove disappointing, however, as the algorithm may converge toward local minima of the error rate that do not correspond to the optimum threshold value.

The invention exploits a general property of binary transmission whereby, statistically speaking, the number of 0 bits and the number of 1 bits sent are substantially equal. This approach is particularly suitable for many transmission systems that employ scrambling of the binary data prior to transmission and corresponding descrambling on reception.

The aim of this scrambling, which is effected in the transcoding module 1 shown in FIG. 1, for example, is that the binary data sent should be such that the modulated electrical and optical signals sent, and therefore received, resulting therefrom have particular properties that facilitate their processing by the receiver.

One of those properties is the fact that in any sequence of data consisting of a minimum number of predefined bits, the number of 0 bits must remain close to the number of 1 bits. This ensures that the signal transmitted has a mean value that is independent of the information transmitted over any time period at least equal to the transmission time corresponding to this minimum number of bits. Another example of a property aimed at facilitating clock timing recovery is the fact that the series of consecutive 0 bits and the series of consecutive 1 bits are of limited duration.

In the light of the above remarks, the invention proposes a new method of determining the decision threshold level that avoids the drawbacks of the solutions discussed above.

SUMMARY OF THE INVENTION

To this end, the invention consists in a device for converting into a digital signal a received signal modulated at the timing rate of a clock and comprising successive bits in the form of modulation between low and high amplitude levels, said device including:
  a decision circuit for supplying, as a function of a comparison of the amplitude of said received signal to a decision threshold level, a binary signal having a first state or a second state according to whether said amplitude is less than or greater than said decision threshold level, said first and second states being respectively associated with first and second bit values; and
  a control circuit for adjusting the threshold value of said decision threshold level; said device being characterized in that said control circuit comprises:
  a first counting module able to calculate a differential numerical value representing the algebraic difference between the two numbers of bits of the binary signal and that respectively have said second binary value and said first binary value, this counting module supplying an indication of the sign of said difference;
  a control module for the first counting module for defining the durations of successive time periods during which said differential numerical value is calculated; and
  an adjustment module adapted to increase or to decrease said threshold value by an increment value at the end of each time period according to whether said sign indication respectively indicates a positive sign or a negative sign.

In an embodiment of the invention that is particularly simple to implement said control module receives said differential numerical value and defines the end of a time period as the time at which the absolute value of that differential numerical value calculated from the beginning of that time period reaches a limit value, that time also defining the beginning of a subsequent time period.

In a variant that accelerates the adjustment whilst avoiding instability of the threshold value in the vicinity of its optimum value, said adjustment module adjusts said increment value in accordance with a decreasing function of said duration of the successive time periods.

In another embodiment said adjustment module comprises a timing circuit including a source of clock pulses and a second counting module adapted to count the pulses produced by said source during each of said successive time periods.

Said source advantageously produces said clock pulses with a frequency that is a submultiple of the clock frequency timing the modulation of the received signal.

The invention also provides a receiver for a transmission system including the above kind of converter.

The invention finally provides a transmission system including the above kind of receiver.

BRIEF DESCRIPTION OF THE DRAWINGS

Other aspects and advantages of the invention will become apparent in the remainder of the description, which is given with reference to the drawings.

FIG. 1 shows the transmission system already commented on above.

FIG. 2 shows one embodiment of a converter of the invention.

FIG. 3 consists of timing diagrams showing examples of received signals used to explain the principle of the invention.

FIG. 4 is a timing diagram showing one example of the evolution over time of the increment value of the threshold value in one variant of the invention.

FIG. 2 shows diagrammatically and by way of example a converter 6 of the invention that can form part of the receiver RX of the transmission system shown in FIG. 1.

DETAILED DESCRIPTION OF THE INVENTION

The converter 6 comprises a decision circuit 6a associated with a control circuit 6b. The decision circuit 6a, which is of a standard type, essentially comprises a comparator 9 receiving at a first input a signal Sr from an optical-to-electronic converter 5 and at a second input a threshold value Vth from a control circuit 6b. The output of the comparator 9 is connected to a circuit 10 for recovering the clock signal CK and to a sampling and shaping circuit 11.

In the conventional way, the comparator 9 supplies a comparison signal Sc that can assume a first level or a second level according to whether the amplitude of the signal Sr is less than or greater than the threshold value Vth.

Thanks to the transitions present in the signal Sc, the circuit 10 is able to create a recovered clock signal CK, i.e. a periodic signal having the same bit frequency as the signal Sc and having a phase related to that of that signal. The circuit 11 can supply in response to the clock signal CK and the comparison signal Sc a calibrated binary signal Sb with the required format.

The control circuit 6b of the invention adjusts the threshold value Vth in the manner explained below, but before that it is necessary to explain the principle of the invention by means of the FIG. 3 timing diagrams.

Those timing diagrams show the respective variations as a function of time of the amplitude V of two examples Sr1 and Sr2 of the signal Sr comprising the same binary sequence 0 1 1 0 1 0 0 1.

The signal Sr1 represented in dashed line corresponds to the ideal situation in which the threshold value Vth is correctly adjusted, i.e. substantially equal to the average of the minimum level V0 and maximum level V1 of the signal amplitude. In contrast, the signal Sr2 represented in solid line corresponds to an unfavorable situation in which, the maximum level V2 being lower, the same threshold value Vth is higher than that average value.

It is clear that comparing the amplitude of the signal Sr1 with the threshold value Vth will enable the comparator 9 easily to supply a comparison signal Sc whose successive low or high levels correspond to the binary sequence. The same will apply to the resulting binary signal Sb.

For the signal Sr2, on the other hand, given amplitude and phase noise (not shown), it is probable that one or more bits having the value "1" when sent will be recognized as having the value "0" when received. The same errors will also occur in the binary signal Sb.

Assuming that in the absence of errors any "long" binary sequence of the signal should include substantially the same number of "0" bits as "1" bits, it may be said that over a sufficient given time period (or a sufficient given length binary sequence) the algebraic difference ADN between the numbers N1 and N0 of bits of the binary signal Sb and respectively having the values "1" and "0" constitutes an estimate of the difference between the effective threshold value Vth and an optimum threshold value. This estimate ignores other causes of errors, but their contributions are a priori random and the resulting errors should, statistically speaking, impact equally on the values "1" and "0", and would therefore have no effect on the difference ADN.

Accordingly, the absolute value DN of the difference ADN=N1−N0 may be interpreted as twice the total number of erroneous bits caused by an incorrect threshold value in a binary sequence including N1+N0 bits. Moreover, a positive value of ADN indicates an excess of "1" bits and therefore, with the convention adopted here, that the threshold is too low. Conversely, a negative value of ADN indicates that the threshold is too high. The sign SDN of ADN therefore indicates in which direction the threshold value Vth must converge to approach its optimum value. The ratio ER=DN/2 (N1+N2) gives an indication of the difference between the current and optimum values of the-threshold. Note that this ratio ER is similar to a bit error rate for the sequence concerned and can take values less than or equal to ½.

A control system can therefore be envisaged which adjusts the threshold value Vth as a function of ER, which is calculated periodically.

The invention nevertheless proposes a different method allowing simpler implementation and faster control. To be more precise, it consists in defining successive time periods during each of which a differential numerical value is calculated by counting that represents the algebraic difference ADN between the numbers N1 and N0 of bits of the binary signal Sb respectively having the second binary value ("1") and the first binary value ("0"). This calculation provides in particular an indication of the sign SDN of the algebraic difference ADN.

Then, at the end of each time period, the threshold value Vth is increased or decreased by an increment value (positive parameter) DVth according to whether the sign indicator SDN corresponds to a positive sign or a negative sign, respectively.

The successive time periods may advantageously be determined in the following simple manner. Firstly, the limit value DN0 is assigned to the absolute value DN of the algebraic difference ADN. The end of a time period during which a calculation is in progress is then defined as the time at which the absolute value DN of the algebraic difference ADN calculated from the beginning of that time period reaches the predefined limit value DN0. That time then also defines the start of the next time period.

The advantage of this method is that each time period defines a count time tr whose duration is inversely proportional to the speed at which a number of errors set at DN0 is reached.

If DR is the data rate for the signal Sb, the time for DN to reach DN0 is given by:

$$tr=(N0+N1)/DR \qquad (1)$$

With ER=DN/(N1+N2) and DN=DN0:

$$tr=DN0/(ER.DR) \qquad (2)$$

The absolute rate of variation dVth/dt of the threshold Vth is then:

$$dVth/dt=DVth/tr=DVth.ER.DR/DN0 \qquad (3)$$

In the simplest case, a constant increment value DVth may be chosen. From equation (3), it is seen that the rate of variation of the threshold dVth/dt is then proportional to the ratio ER, which implies a short control response time because the adjustment is increasingly faster as the threshold value Vth departs farther from its optimum value.

In a variant seeking to enhance control stability when the threshold value Vth is close to its optimum value, the increment value DVth is adjusted in accordance with a decreasing function of the time tr. For example, DVth may be varied in accordance with a linear decreasing function of tr, in which case:

$$DVth=\text{Max}\,(0,\,DVth0-k1.tr) \qquad (4)$$

where DVth0 and k1 are constants and:

$$dVth/dt=DVth/tr=\text{Max}\,(0,\,DVth0.ER.DR/DN0-k1) \qquad (5)$$

The presence of the coefficient k1 means that Vth can be maintained at a stable value when ER reaches the limit value that cancels out DVth and therefore dVth/dt. The value of the coefficient k1 is determined by the choice of a limit value that corresponds to a value of ER that it is deemed unnecessary to seek to reduce further.

In one particular situation, a source may be used that produces clock pulses with a frequency proportional to (for cost reasons advantageously a submultiple of) the clock frequency CK timing the modulation of the received signal Sr, in which case:

$$DVth=\text{Max}\,(0,\,DVth0-k2.tr.DR) \qquad (6)$$

where k2 is a constant and:

$$dVth/dt = DVth/tr = \text{Max}(0, DVth0.ER.DR/DN0 - k2.DR) \quad (7)$$

It is seen that in this case the rate of variation of the threshold dVth/dt remains proportional to the data rate DR, which implies a control response time that is inversely proportional to the data rate in a ratio that is independent of the data rate. This results in performance in terms of accuracy that is independent of the data rate.

The FIG. 4 timing diagram illustrates these two situations. It shows the evolution of successive clock pulse counting times tr1-tr3 for DN to reach DN0 when the threshold value Vth converges progressively toward the optimum threshold value. The resulting values DVth1-DVth3 of DVth are plotted on the ordinate axis.

Following the above explanation of the control method of the invention, consider next its practical implementation in the FIG. 2 control circuit 6b.

The control circuit 6b comprises a first counting module 12 associated with a threshold adjusting module 15.

The first counting module 12 consists essentially of a conventional up/down counter having a counting input cp, an up or down counting selection input u/d, an input RS for resetting the counter to 0, a parallel output CT delivering a binary number that is the absolute value of the counter state, and an output Sg supplying a signal indicating the sign SDN of the counter state.

The inputs cp and u/d receive the recovered clock signal CK and the binary signal Sb, respectively.

A digital comparator 13 has a first input connected to the parallel output of the module 12, a second input receiving the binary number DN0, and an output supplying an active signal EQ when the binary number received by its first input is at least equal to DN0. The signal EQ is then applied to a synchronization bistable 14 controlled by the clock signal CK. The signal LD supplied by the bistable is applied to the reset to 0 input RS.

Given the signals applied to the inputs of the module 12, it is clear that, according to the binary value 1 or 0 present in the signal Sb, its count state increases or decreases by one unit for each corresponding clock period. Accordingly, after the module 12 has been reset to 0, it subsequently contains a count equal to the algebraic difference between the numbers of 1 and 0 bits in the binary signal from the time of that reset to 0, i.e. the algebraic difference ADN made up of its absolute value DN at the parallel output CT and its sign SDN at the sign output sg.

When DN reaches DN0, the signal EQ changes state and the signal LD becomes active on the next clock period, which causes the module 12 to be reset to 0. The components 13 and 14 therefore constitute a control module for the counting module 12 that defines the times tr of the successive time periods during which the difference ADN is calculated.

The threshold adjustment module 15 includes an adder/subtractor circuit 16 which has two parallel inputs A and B, a parallel output C, and an add/subtract control input +/−. The input A is connected to the output of a register RA controlled by the signal EQ. The output C is connected to another register RC controlled by the signal LD. The output of the register RC is connected to the input of a digital-to-analog converter 17 and to the input of the register RA. The control input +/− receives the signal SDN indicating the sign. The converter 17 supplies at its output the threshold value Vth applied to the comparator 9.

The input B receives a numerical value DTh representing the increment value DVth. This may be fixed or variable. The embodiment described here corresponds to the variable option. For this purpose, the input B is connected to the output of a third register RB controlled by the signal EQ. The register RB is loaded with the numerical value DTh supplied by components 18 to 20 described in detail later.

The register RC contains a numerical value Th representing the latest threshold value Vth to be used. The register RA contains the numerical value Th representing the preceding threshold value Vth.

Accordingly, when DN reaches DN0, the signal EQ changes state and causes the loading into the registers RA and RB, respectively, of the value of Th representing the latest threshold value and the numerical value DTh representing the increment value DVth.

According to whether the sign SDN is positive or negative at this time, the circuit 16 is commanded to operate as an adder or as a subtractor and supplies at its output C, as the new value of Th, the preceding value respectively increased or decreased by DTh. This value of Th is then loaded into the register RC in response to activation of the signal LD in the next clock period.

The FIG. 2 device also uses the variant of the invention that adjusts the increment value DVth in accordance with a positive decreasing function of the time tr during which the difference ADN is calculated.

To this end, a timing circuit is provided consisting of a source 19 of clock pulses CL and a second counting module 18 for counting the pulses produced by the source 19. The module 18 has a reset to 0 input receiving the signal LD and a parallel output connected to an input of a digital transcoder 20 serving as a digital conversion table.

Accordingly, the second counting module 18 is reset to 0 when the new value of Th is loaded into the register RC in response to activation of the signal LD. It then counts the pulses CL produced by the source 19. Its state therefore evolves from resetting it to 0, assuming count values applied to the input of the transcoder 20 that are proportional to the elapsed time.

The time at which DN reaches 0 defines the end of the time period during which the difference ADN is calculated. At this time the signal EQ changes state, the counting module 18 has at its output a count value TR proportional to the duration tr of that time period, and the digital transcoder 20 delivers at its output the numerical value DTh representing the new increment value DVth. The change of state of the signal EQ then causes the new numerical increment value DTh to be loaded into the register RB.

The digital transcoder 20 may be programmed to apply to the binary number that it receives at its input, i.e. the number TR, a selected digital function, for example a linear function of the form DTh=DTh0−K1.TR, provided that this expression remains positive, this function remaining equal to 0 otherwise.

The clock pulses CL are produced by the source 19 at a constant frequency which may be very much lower than the bit frequency of the signal. The clock frequency CL may also be made equal to a submultiple of the bit frequency in a fixed ratio that is independent of the bit frequency. This may be achieved by using as the source 19 a frequency divider receiving the clock signal CK at its input.

For a practical implementation, a value must be chosen for DN0. This choice is not very critical and may depend essentially on the required control response time and the bit rate. For example a value of the order of 100 will suit in most ordinary situations.

For the variant of the invention in which the increment value DVth is variable, the minimum and maximum variation steps applicable to the increment are also defined. They may be defined as percentages of the excursion allowed for the threshold value Vth, and made equal to 1% and 20%, respectively, for example.

The above choices then enable the various digital components of the control circuit 6b to be rated accordingly.

Of course, the invention is not limited to the embodiments that have just been described. In particular, the digital circuits may be replaced by a digital processing device programmed to execute analogous functions.

What is claimed is:

1. A device (6) for converting into a digital signal a received signal (Sr) modulated at the timing rate of a clock (CK) and comprising successive bits in the form of modulation between low and high amplitude levels, said device including:

a decision circuit (6a) for supplying, as a function of a comparison of an amplitude (V) of said received signal (Sr) to a decision threshold level, a binary signal (Sb) having a first state or a second state according to whether said amplitude is less than or greater than said decision threshold level, said first and second states being respectively associated with first and second bit values; and a control circuit (6b) for adjusting a threshold value (Vth, Th) of said decision threshold level;

said device being characterized in that said control circuit (6b) comprises:

a first counting module (12) able to calculate a differential numerical value representing an algebraic difference (ADN) between two numbers (N1, N0) of bits of a the binary signal and that respectively have said second bit value and said first bit value, this counting module supplying an indication of the sign (SDN) of said difference;

a control module (13, 14) for the first counting module (12) for defining durations (TR, tr1-tr3) of successive time periods during which said differential numerical value is calculated; and an adjustment module (15) adapted to increase or to decrease said threshold value (Vth, Th) by an increment value (DTh) at the end of each time period according to whether said sign indication (SDN) respectively indicates a positive sign or a negative sign.

2. A device according to claim 1, characterized in that said control module (13, 14) receives said differential numerical value (ADN) and defines the end of a time period as the time at which the absolute value (DN) of that differential numerical value calculated from the beginning of that time period reaches a limit value (DN0), that time also defining the beginning of a subsequent time period.

3. A device according to claim 2, characterized in that said adjustment module (15) adjusts said increment value (DTh) in accordance with a decreasing function of said duration (TR) of the successive time periods.

4. A device according to claim 3, characterized in that said adjustment module (15) comprises a timing circuit (18, 19) including a source (19) of clock pulses (CL) and a second counting module (18) adapted to count the pulses produced by said source during each of said successive time periods.

5. A device according to claim 4, characterized in that said source (19) produces said clock pulses with a frequency that is a submultiple of the clock frequency (CK) timing the modulation of the received signal (Sr).

6. A receiver (RX) for a transmission system, characterized in that it includes a device (6) according to claim 1.

7. A transmission system including at least one transmitter (TX) connected to a receiver (RX) via a connection (L), characterized in that said receiver (RX) conforms to claim 6.

* * * * *